(12) United States Patent
Lin et al.

(10) Patent No.: US 8,547,728 B2
(45) Date of Patent: Oct. 1, 2013

(54) NON-VOLATILE MEMORY DEVICE AND METHODS FOR MANUFACTURING THE SAME

(75) Inventors: Chrong-Jung Lin, Hsinchu (TW); Ya-Chin King, Taipei (TW)

(73) Assignees: Chrong-Jung Lin, Hsinchu (TW); Ya-Chin King, Taipei (TW)

( * ) Notice: Subject to any disclaimer, the term of this patent is extended or adjusted under 35 U.S.C. 154(b) by 56 days.

(21) Appl. No.: 13/338,273

(22) Filed: Dec. 28, 2011

(65) Prior Publication Data
US 2012/0091424 A1  Apr. 19, 2012

Related U.S. Application Data

(62) Division of application No. 12/512,045, filed on Jul. 30, 2009, now Pat. No. 8,107,274.

(51) Int. Cl.
*G11C 11/00*  (2006.01)
(52) U.S. Cl.
USPC ............................................. 365/148; 365/163

(58) Field of Classification Search
USPC .................. 365/148, 163, 63; 257/4, 314
See application file for complete search history.

(56) References Cited

U.S. PATENT DOCUMENTS
8,054,674 B2 * 11/2011 Tamai et al. ................... 365/148
* cited by examiner

*Primary Examiner* — Vu Le
(74) *Attorney, Agent, or Firm* — CKC & Partners Co., Ltd.

(57) ABSTRACT

A variable and reversible resistive element includes a transition metal oxide layer, a bottom electrode and at least one conductive plug module. The bottom electrode is disposed under the transition metal oxide layer. The conductive plug module is disposed on the transition metal oxide layer. The conductive plug module includes a metal plug and a barrier layer. The conductive plug is electrically connected with the transition metal oxide layer. The barrier layer surrounds the metal plug, wherein the transition metal oxide layer is made by reacting a portion of a dielectric layer being directly below the metal plug and a portion of the barrier layer contacting the portion of the dielectric layer, wherein the dielectric layer is formed on the bottom electrode. Moreover, a non-volatile memory device and methods for operating and manufacturing the same is disclosed in specification.

7 Claims, 5 Drawing Sheets

NON-VOLATILE MEMORY DEVICE AND METHODS FOR MANUFACTURING THE SAME

RELATED APPLICATIONS

The present application is a divisional of U.S. application Ser. No. 12/512,045, filed on Jul. 30, 2009, which is herein incorporated by reference.

BACKGROUND

1. Technical Field

The present disclosure relates to semiconductors. More particularly, the present disclosure relates to semiconductor memory devices.

2. Description of Related Art

The development of semiconductor memory devices having higher integration and lower power consumption has been the focus of recent research.

Non-volatile memory, nonvolatile memory, NVM or non-volatile storage, is computer memory that can retain the stored information even when not powered. Examples of non-volatile memory include read-only memory, flash memory, most types of magnetic computer storage devices (e.g. hard disks, floppy disk drives, and magnetic tape), optical disc drives, and early computer storage methods such as paper tape and punch cards.

Urgent demands on finding new solutions for next generation NVM have spurred many research activities in ReRAM (resistance-change random-access memory) studies. The promising results shown in recent ReRAM works suggest that it might be able to substitute floating gate memories and become the next mainstream NVM device. The switching resistor in the 1T+1R ReRAM cell (one transistor+1 Resistor) is realized by backend process with a metal-dielectric-metal structure.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one aspect, the present disclosure is directed to a variable and reversible resistive element.

According to one embodiment of the present invention, the variable and reversible resistive element comprises a transition metal oxide layer for resistance change, a bottom electrode and at least one conductive plug module. The bottom electrode is disposed under the transition metal oxide layer. The conductive plug module is disposed on the transition metal oxide layer. The conductive plug module comprises a metal plug and a barrier layer. The metal plug is vertically over the bottom electrode. The barrier layer surrounds the metal plug and electrically connected with the transition metal oxide layer, wherein the transition metal oxide layer is made by reacting a portion of a dielectric layer being directly below the metal plug and a portion of the barrier layer touching the portion of the dielectric layer, wherein the dielectric layer is formed on the bottom electrode.

In another aspect, the present disclosure is directed to a non-volatile memory device.

According to one embodiment of the present invention, the non-volatile memory device comprises a transistor and a variable and reversible resistive element. The transistor comprises a gate electrode, a gate dielectric layer, a first source/drain and a second source/drain. The gate dielectric layer is disposed on a well, and the gate electrode is disposed on the gate dielectric layer. The first source/drain and the second source/drain are formed in the well and are disposed at opposing sides of the gate electrode. The variable and reversible resistive element comprises a transition metal oxide layer, a dielectric layer and at least one conductive plug module. The transition metal oxide layer is capable of resistance change. The dielectric layer is formed on the first source/drain. The conductive plug module is disposed on the transition metal oxide layer. The conductive plug module comprises a metal plug and a barrier layer. The metal plug is vertically disposed over the first source/drain. The barrier layer surrounds the metal plug and is electrically connected with the transition metal oxide layer. In the formation process of the non-volatile memory device, the transition metal oxide layer is made by reacting a portion of a dielectric layer being directly below the metal plug with a portion of the barrier layer touching the portion of the dielectric layer, and thereby a remaining portion of the dielectric layer remains on the first source/drain after the transition metal oxide layer is formed.

In another aspect, the present disclosure is directed to a method for operating the above non-volatile memory device.

According to one embodiment of the present invention, the method for operating the above non-volatile memory device comprises steps as follows. A first read voltage is applied between the gate electrode and the well for turning on a channel between the first source/drain and the second source/drain in the well, and a second read voltage is applied between the metal plug and the second source/drain for generating electric current flowing through the channel and the transition metal oxide layer. Then, the amperage of the electric current is measured, and whether resistance of the transition metal oxide layer is set or reset is decided according to the amperage of the electric current.

In another aspect, the present disclosure is directed to a method for manufacturing a non-volatile memory device.

According to one embodiment of the present invention, the method for manufacturing a non-volatile memory device comprises steps as follows. First, a transistor that comprises a gate electrode and a first source/drain and a second source/drain is formed, where the first source/drain and the second source/drain are disposed at opposing sides of the gate electrode. Then, a dielectric layer is formed on the first source/drain, and an interlayer insulating layer is formed on the dielectric layer. Then, at least one opening is formed through the interlayer insulating layer to the dielectric layer by etching process. Then, a barrier layer on an inner wall of the opening and on a portion of the dielectric layer is formed for reacting a portion of the barrier layer with the portion of the dielectric layer contacting the portion of the barrier layer to form a transition metal oxide layer, thereby a remaining portion of the dielectric layer remains on the first source/drain after the transition metal oxide layer is formed. Moreover, a metal plug is formed in the opening after the barrier layer is formed, and thereby the metal plug is electrically connected to the transition metal oxide layer.

BRIEF DESCRIPTION OF THE DRAWINGS

The present description will be better understood from the following detailed description read in light of the accompanying drawings, wherein.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples. Wherever possible, the same reference numerals are used in the drawings and the description to refer to the same or like parts.

Figure 1A:
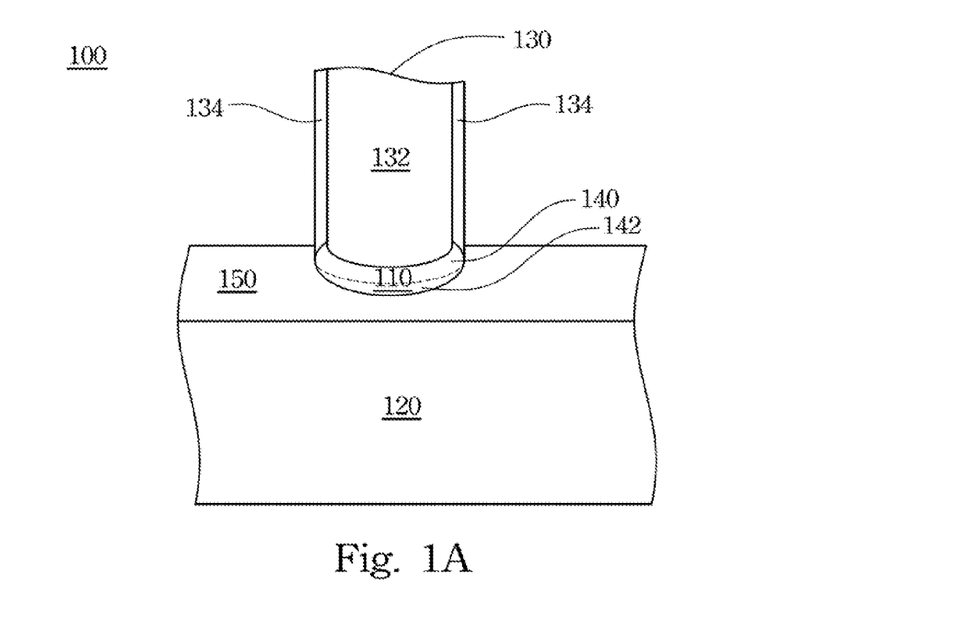
FIG. 1A is a cross-sectional view showing a variable and reversible resistive element according to one embodiment of the present invention.

Please refer to FIG. 1A. FIG. 1A is a cross-sectional view showing a variable and reversible resistive element 100 according to an embodiment of the present invention. The variable and reversible resistive element 100 comprises a transition metal oxide layer 110, a bottom electrode 120 and at least one conductive plug module 130. Transition metal oxide materials comprise a class of materials that contain transition elements and oxygen. They include insulators as well as (poor) metals. Often the same material may display both types of transport properties. The transition metal oxide may be at least one selected from the group consisting of $CeO_2$, $VO_2$, $V_2O_5$, $Nb_2$, $Ta_2O_5$, ZnO, $TiO_2$, TiON, $Nb_2O_5$, $ZrO_2$, HfO, WO, CoO, NbO or NiO etc. The transition metal oxide layer 110 is capable of resistance change. The bottom electrode 120 is disposed under the transition metal oxide layer 110. The conductive plug module 130 is disposed on the transition metal oxide layer 110.

The conductive plug module 130 comprises a metal plug 132 and a barrier layer 134. The stacked metal plug 132 and the barrier layer 134 are vertically disposed over the bottom electrode 120 and electrically connected with the transition metal oxide layer 110. The barrier layer 134 surrounds the metal plug 132. In the formation process of the variable and reversible resistive element 100, the transition metal oxide layer 110 formed at the regions 140 and 142 is made by reacting a portion of a dielectric layer 150 being directly below the metal plug 132 at the region 140 with a portion of the barrier layer 134 touching the portion of the dielectric layer 150 at the region 142, where the dielectric layer 150 is formed on the bottom electrode 120, and thereby a remaining portion of the dielectric layer 150 remains on the bottom electrode 120 after the transition metal oxide layer 110 is formed.

The transition metal oxide layer 110 is formed on the remaining portion of the dielectric layer 150, and the transition metal oxide layer 110 is electrically coupled with the bottom electrode 120 via the remaining portion of the dielectric layer 150.

The dielectric layer 150 consists essentially of oxide or oxynitride material, wherein the oxide or oxynitride material may be selected from the group consisting of SiOx, SixNy, SiOxNy and combinations thereof. For example, the dielectric layer 150 comprises one or more layers of SiOx, SiOxNy, or the like.

In the fabrication of integrated circuit devices, silicidation processes are often used in order to obtain higher circuit performance. In silicidation, a refractory metal layer is deposited and then annealed. The underlying silicon reacts with the refractory metal layer to produce a silicide overlying the gate electrode and source and drain regions. The silicided gate and source/drain regions have lower resistance than non-silicided regions, especially in smaller geometries, and hence, higher circuit performance.

It may be desired to perform silicidation on one part of a wafer while protecting another portion of the wafer from silicidation. A resist protective oxide layer a self-aligned silicide block layer is deposited over semiconductor device structures and then selectively removed where silicidation is desired. The dedicated layer will prevent silicidation where it remains over the semiconductor device structures.

In one embodiment of the present invention, the resistive protection oxide layer or a self-aligned silicide block layer in normal semiconductor processing can be used and implemented as the dielectric layer 150.

The barrier layer 134 is a thin layer (usually micrometers thick) of metal usually placed between two other metals/electrode. It is done to act as a "barrier" to protect either one of the metals/electrode from corrupting the other.

In one embodiment, the barrier layer 134 comprises barrier material, wherein the barrier material may be selected from the group consisting of titanium nitride, tantalum nitride, indium oxide, copper silicide, tungsten nitride and combinations thereof. For example, the barrier layer 134 comprises one or more layers of titanium nitride, tantalum nitride, or the like.

The metal plug 132 is made of a metal that may be tungsten, copper, nickel, aluminum, and combinations thereof, or the like.

The bottom electrode 120 essentially consists of an impurity-doped region within or upon a semiconductor substrate. In the embodiment, the bottom electrode 120 may be a source/a drain or a poly gate of a transistor.

Figure 1B:
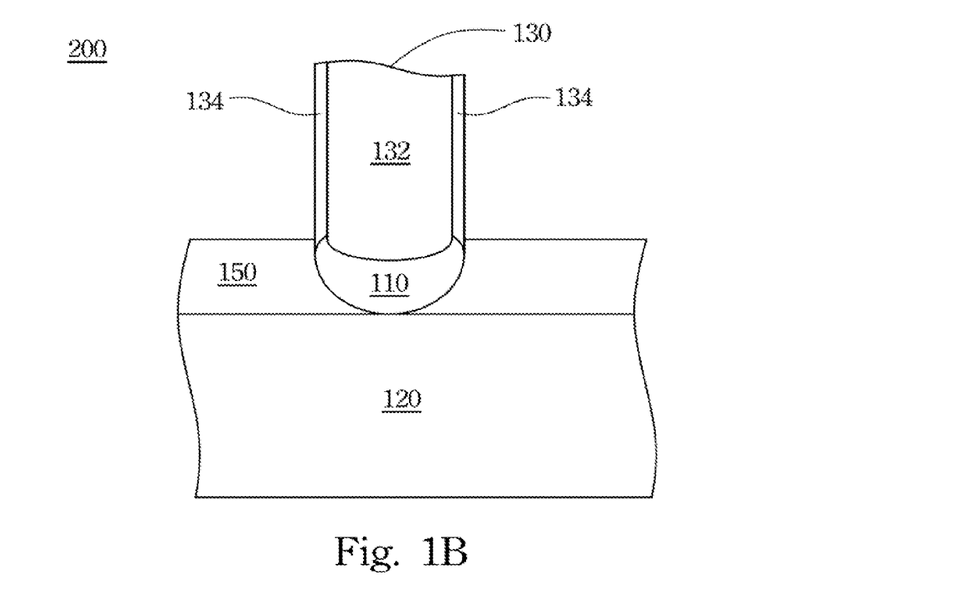
FIG. 1B is a cross-sectional view showing a variable and reversible resistive element according to another embodiment of the present invention.

Please refer to FIG. 1B. FIG. 1B is a cross-sectional view showing a variable and reversible resistive element 200 according to another embodiment of the present invention. The variable and reversible resistive element 200 is essentially the same as the variable and reversible resistive element 100, except that the transition metal oxide layer 110 is formed on the bottom electrode 120, and thereby the remaining portion of the dielectric layer 150 surrounds transition metal oxide layer 110. In the formation process of the variable and reversible resistive element 200, the portion of the dielectric layer 150 between the metal plug 132 and the bottom electrode 120 is combined with the portion of the barrier layer 134 to form the transition metal oxide layer 110 contacting the bottom electrode 120.

Figure 2A:
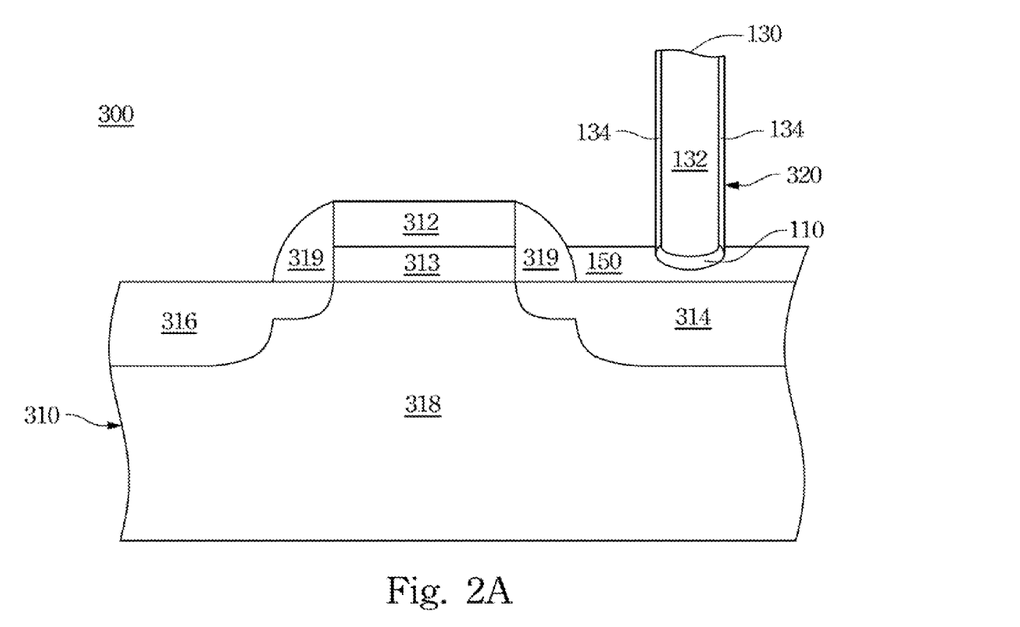
FIG. 2A is a cross-sectional view showing a non-volatile memory device according to another embodiment of the present invention.

Please refer to FIG. 2A. FIG. 2A is a cross-sectional view showing a non-volatile memory device 300 according to another embodiment of the present invention. The non-volatile memory device 300 comprises a transistor 310 and a variable and reversible resistive element 320. The transistor 310 is connected with the variable and reversible resistive element 320.

The transistor 310 comprises a gate electrode 312, a gate dielectric layer 313, a first source/drain 314 and a second source/drain 316. The gate dielectric layer 313 is disposed on a well or substrate 318, and the gate electrode 312 is disposed on the gate dielectric layer 313. For example, the first source/drain 314 is the source of the transistor 310, and the second source/drain 316 is the drain of the transistor 310; alternatively, the first source/drain 314 is the drain of the transistor 310, and the second source/drain 316 is the source of the transistor 310. In addition, the transistor 310 may comprise spacers 319. The spacers 319 are formed alongside the gate electrode 312.

The variable and reversible resistive element 320 comprises a transition metal oxide layer 110, a dielectric layer 150 and at least one conductive plug module 130. The transition metal oxide layer 110 is capable of resistance change. The dielectric layer 150 is formed on the first source/drain 314. The conductive plug module 130 is disposed on the transition metal oxide layer 110.

The conductive plug module 130 comprises a metal plug 132 and a barrier layer 134. The metal plug 132 is vertically disposed over the first source/drain 314. The barrier layer 134 surrounds the metal plug 132 and is electrically connected with the transition metal oxide layer 110. In the formation process of the non-volatile memory device 300, the transition metal oxide layer 110 is made by reacting a portion of the dielectric layer 150 being directly below the metal plug 132 and a portion of the barrier layer 134 touching the portion of the dielectric layer, and thereby a remaining portion of the dielectric layer 150 remains on the first source/drain 314 after the transition metal oxide layer 110 is formed.

It should be noted that the entire dielectric layer 150 is illustrated on the first source/drain 314 for illustrative purposes only; for example, the dielectric layer 150 may be extended on the gate electrode 312.

The transition metal oxide layer 110 is formed on the remaining portion of the dielectric layer 150, and the transition metal oxide layer 110 is electrically coupled with the first source/drain 314 via the remaining portion of the dielectric layer 150.

It should be noted that the conductive plug module 130 is illustrated as a single one for illustrative purposes only; for example, a plurality of conductive plug modules for multi-level memory may be disposed on the different location areas of transition metal oxide layers, and the first source/drain 314 is disposed under the transition metal oxide layers.

Figure 2B:
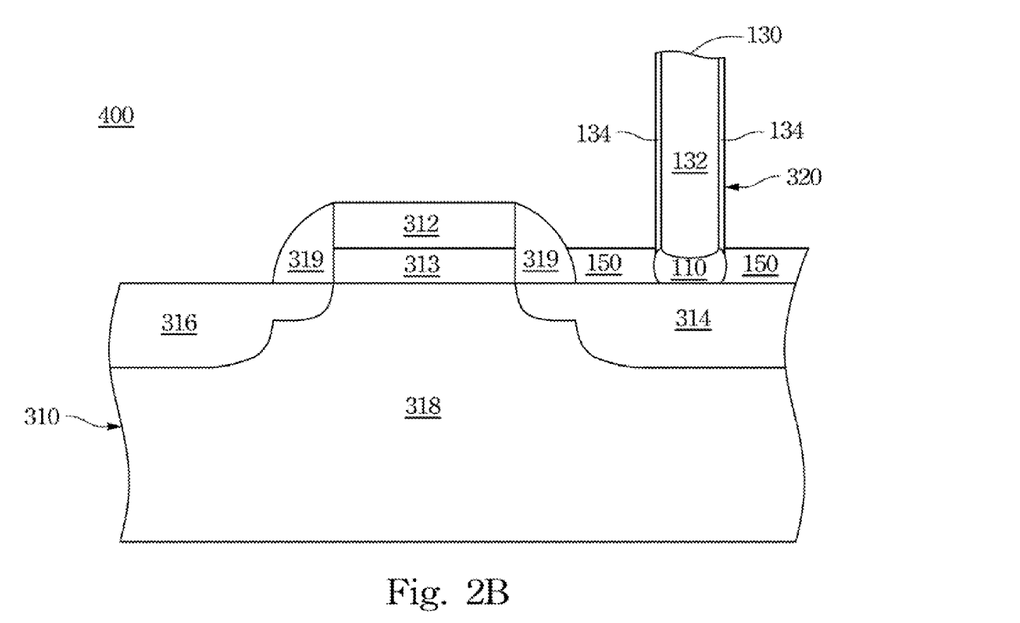
FIG. 2B is a cross-sectional view showing a non-volatile memory device according to another embodiment of the present invention.

In addition, a conductive plug (not shown) can be vertically disposed on the second source/drain 316. For example, an external electrical potential is applied to the second source/drain 316 through the conductive plug; alternatively, the external electrical potential is directly applied to the second source/drain 316. Please refer to FIG. 2B. FIG. 2B is a cross-sectional view showing a non-volatile memory device 400 according to another embodiment of the present invention. The non-volatile memory device 400 is essentially the same as the non-volatile memory device 300, except that the transition metal oxide layer 110 is formed on the first source/drain 314, and thereby the remaining portion of the dielectric layer 150 surrounds the transition metal oxide layer 110. In the formation process of non-volatile memory device 400, the portion of the dielectric layer 150 between the metal plug 132 and the first source/drain 314 is combined with the portion of the barrier layer 134 to form the transition metal oxide layer 110 contacting the first source/drain 314.

In practice, the non-volatile memory device 300 or 400 may utilize a resistance transition characteristic of the transition metal oxide 110 wherein resistance varies according to a change in voltage. A plurality of the non-volatile memory devices may constitute a resistance random access memory (ReRAM).

In one case, ReRAM is structured as a metal-insulator-metal (MIM) structure, wherein a resistance-varying material is disposed between two metal layers. In above embodiment, it is different form the MIM ReRAM; the metal oxide layer 110 is formed between the metal plug 132 and the first source/drain 314.

Moreover, the method for operating the non-volatile memory device 300 or 400 is disclosed as follows. When the non-volatile memory device 300 or 400 is read, a first read voltage is applied between the gate electrode 312 and the well 318 for turning on a channel between the first source/drain 314 and the second source/drain 316 in the well 318, and a second read voltage is applied between the second source/drain 316 and the metal plug 132 for generating electric current flowing through the channel, the first source/drain 314 and the transition metal oxide layer 110. For example, the channel is a n-channel, and the electrical potential of the second source/drain 316 is greater than the electrical potential of the metal plug 132 when the second read voltage is applied; alternatively, the channel is a p-channel, and the electrical potential of the second source/drain 316 is less than the electrical potential of the metal plug 132 when the second read voltage is applied. Then, the amperage of the electric current is measured, and whether resistance of the transition metal oxide layer 110 is set or reset is decided according to the amperage of the electric current with the predetermined gate voltage. The predetermined gate voltage is designated for sufficient read current margin to differentiate set or reset state.

In the embodiment, when the non-volatile memory device 300 or 400 is set, so that the resistance of the transition metal oxide layer 110 is turned to be relatively low, and thereby the measured amperage of the electric current is relatively high; on the contrary, when the non-volatile memory device 300 or 400 is processed with reset operation, so that the resistance of the transition metal oxide layer 110 is changed to be relatively high, and thereby the measured amperage of the electric current is turned to be relatively low.

When setting the non-volatile memory device 300 or 400, a first set voltage is applied between the gate electrode 312 and the well 318 for turning on the channel, and a second set voltage is applied between the metal plug 132 and the second source/drain 316 to set the resistance of the transition metal oxide layer 110. For example, the channel is a n-channel, and the electrical potential of the second source/drain 316 is greater than the electrical potential of the metal plug 132 when the second set voltage is applied; alternatively, the channel is a p-channel, and the electrical potential of the second source/drain 316 is less than the electrical potential of the metal plug 132 when the second set voltage is applied. Thus, the resistance of the transition metal oxide layer 110 is relatively low.

When resetting the non-volatile memory device 300 or 400, a first reset voltage is applied between the gate electrode 312 and the well 318 for turning on the channel after applying the first set voltage is performed, and a second reset voltage is applied between the metal plug 132 and the second source/drain 316 to reset the set resistance of the transition metal oxide layer 110, wherein the absolute value of the second set voltage is greater than the absolute value of the second reset voltage. For example, the channel is a n-channel, and the electrical potential of the second source/drain 316 is less than the electrical potential of the metal plug 132 when the second reset voltage is applied; alternatively, the channel is a p-channel, and the electrical potential of the second source/drain 316 is greater than the electrical potential of the metal plug 132 when the second reset voltage is applied. Thus, the resistance of the transition metal oxide layer 110 is relatively high.

Figure 3:
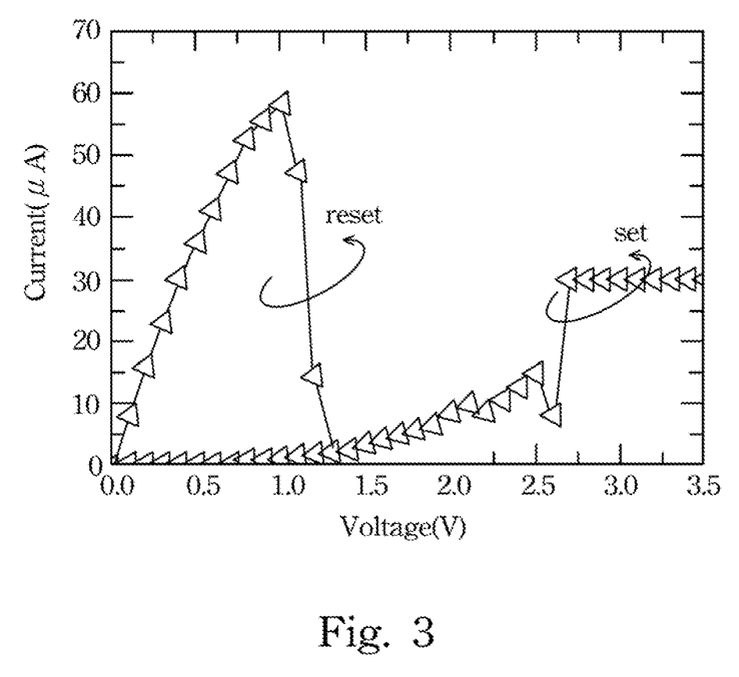
FIG. 3 is a graph depicting the state of the non-volatile memory device of FIG. 2A.

Please refer to FIG. 3. FIG. 3 is a graph depicting the state of the n-channel non-volatile memory device of FIG. 2A. In the graph, the abscissa represents the voltage between the metal plug 132 and the second source/drain 316, and the ordinate represents the electric current flowing through the transition metal oxide layer 110. A table of the state of the non-volatile memory device for each terminal is shown below:

| | Operation | | | | | |
| --- | --- | --- | --- | --- | --- | --- |
| | SET | | RESET | | READ | |
| Terminal | Select | Un-select | Select | Un-select | Select | Un-select |
| gate electrode | 0.8 V | 0 V | 2 V | 0 V | 1.2 V | 0 V |
| second source/drain | 0 V | Float | 0 V | Float | 0.4 V | 0 V |
| metal plug | 4 V | 0 V | 1.8 V | 0 V | 0 V | 0 V |
| well (p-type) | 0 V | 0 V | 0 V | 0 V | 0 V | 0 V |

When setting the n-channel non-volatile memory device, the first set voltage that may be 0.8 V is applied between the gate electrode 312 and the well 318, and the second set voltage that may be 4 V is applied between the metal plug 132 and the second source/drain 316 to set resistance of the transition metal oxide layer 110; at this time, the electric current flowing through the transition metal oxide layer 110 is about 30 μA.

When resetting the n-channel non-volatile memory device, the first reset voltage that may be 2 V is applied between the gate electrode 312 and the well 318, and the second reset voltage that may be 1.8 V is applied between the metal plug 132 and the second source/drain 316 to reset the set resistance of the transition metal oxide layer 110.

When the n-channel non-volatile memory device is read, a first read voltage that may be 1.2 V is applied between the gate electrode 312 and the well 318, and a second read voltage that may be 0.4 V is applied between the second source/drain 316 and the metal plug 132 for generating electric current flowing through the channel and the transition metal oxide layer 110. Then, the amperage of the electric current is measured, and whether the non-volatile memory device is set or reset is determined according to the amperage of the electric current as shown in the graph.

Accordingly, the method for operating the non-volatile memory device can be performed to alternately set/reset the resistance of the transition metal oxide layer 110, and the method may be repeated in an iterative manner.

Please refer to FIG. 4A, FIG. 4B, FIG. 4C and FIG. 4D. FIG. 4A, FIG. 4B, FIG. 4C and FIG. 4D illustrate various process steps for manufacturing a non-volatile memory device having a transition metal oxide layer according to another embodiment of the present invention.

Figure 4A:
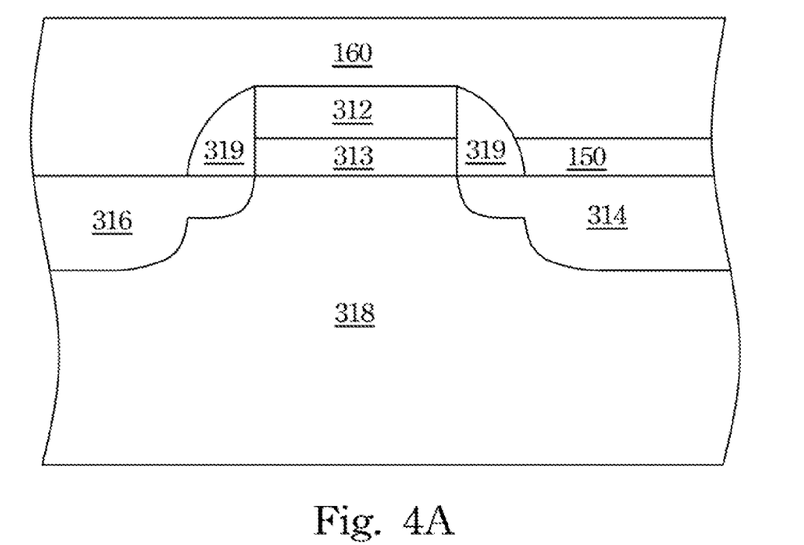
FIG. 4A, FIG. 4B, FIG. 4C and FIG. 4D illustrate various process steps for manufacturing a non-volatile memory device having a transition metal oxide layer according to another embodiment of the present invention.

In FIG. 4A, a transistor is formed, where the transistor comprises a gate electrode 312 and a first source/drain 314 and a second source/drain 316. In the formation process of the transistor, the gate dielectric layer 313 is disposed on a well 318, and the gate electrode 312 is disposed on the gate dielectric layer 313, where the first source/drain 314 and the second source/drain 316 are formed at opposing sides of the gate electrode 312 in well 318. In addition, spacers 319 are formed alongside the gate electrode 312.

Then, a dielectric layer 150 is formed on the first source/drain 314, where the dielectric layer 150 consists essentially of oxide material, wherein the oxide material is selected from the group consisting of SiOx, SiOxNy and combinations thereof. In an alternative embodiment, the dielectric layer 150 is not only formed on the first source/drain 314 but also is extended onto the gate electrode 312. Then, an interlayer insulating layer 160 is formed on the dielectric layer 150 and the transistor.

Figure 4B:
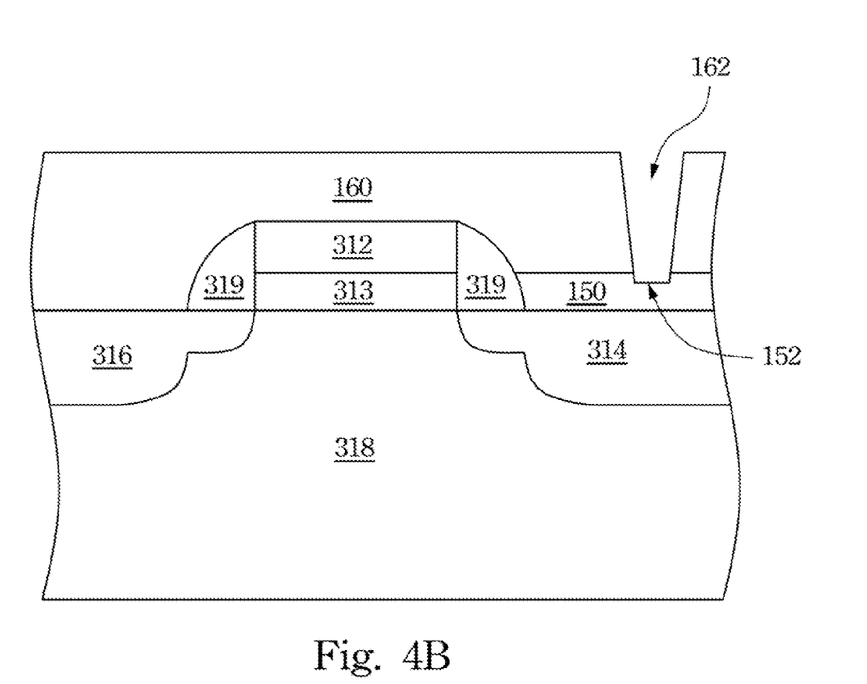

In FIG. 4B, at least one opening 162 through the interlayer insulating layer 160 to the dielectric layer 150 is formed by one or more etching processes. In practice, some of the dielectric layer 150 is etched around the end of the opening 162, and thereby a defective texture of a portion 152 of the dielectric layer 150 is farmed in situ.

Figure 4C:
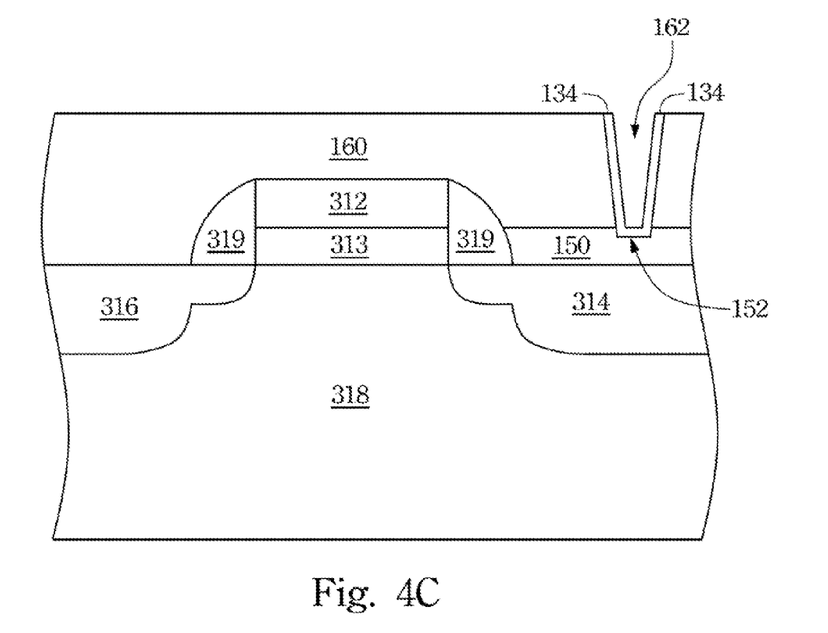
Figure 4D:
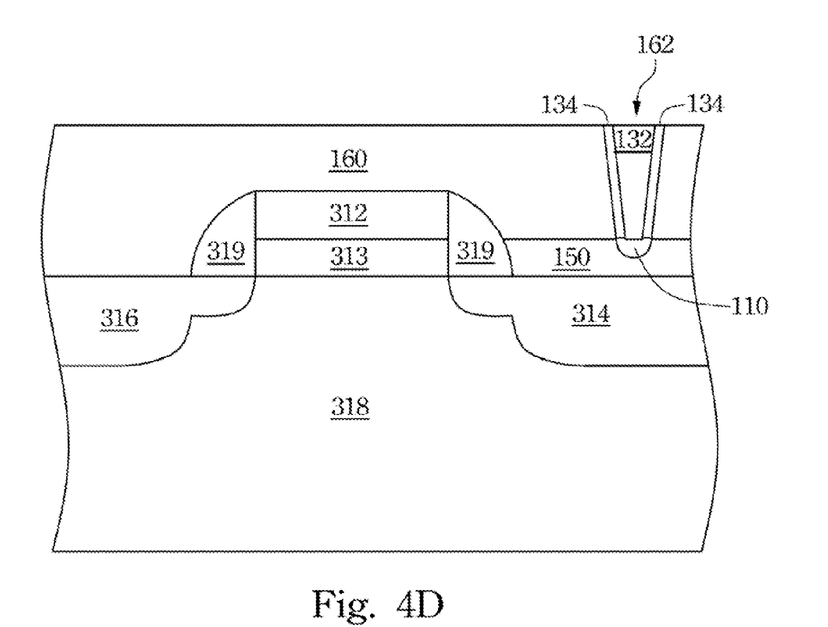

In FIG. 4C, a barrier layer 134 is formed on an inner wall of the opening 162 and on the portion 152 of the dielectric layer 150 for reacting a portion of the barrier layer 134 with the portion 152 of the dielectric layer 150 contacting the portion of the barrier layer 134 to form a transition metal oxide layer 110, as shown in FIG. 4D. The barrier layer 134 may be titanium nitride, tantalum nitride and combinations thereof; for example, the barrier layer 134 comprises one or more layers of titanium nitride, tantalum nitride, or the like.

For instance, the barrier layer 134 contains titanium nitride, and the dielectric layer 150 contains silicon dioxide, so that the transition metal oxide layer 110 containing titanium oxide (TiOx) or titanium oxynitride (TiON) is made by reacting titanium nitride with silicon dioxide. Additionally or alternatively, the barrier layer 134 contains titanium nitride, and the dielectric layer 150 contains silicon oxynitride, so that the transition metal oxide layer 110 containing titanium oxide (TiOx) or titanium oxynitride (TiON) is made by reacting titanium nitride with silicon oxynitride.

In the embodiment, the reacting procedure is performed at a temperature about 300° C.~500° C. during manufacturing processes; alternatively, high-current flows through the barrier layer 134 and the dielectric layer 150 for generating very high temperature locally (this is due to contact plug area is usually very small, and a high current flowing this region will lead to a very high temperature at the local area), so as to form the transition metal oxide layer 110 by reacting a portion of a dielectric layer 150 with a portion of the barrier layer; for example, during above set operation, the high-current flows through the barrier layer 134 and the dielectric layer 150 for generating high temperature locally.

In FIG. 4D, a remaining portion of the dielectric layer 150 remains on the first source/drain after the transition metal oxide layer 110 is formed, and a metal plug 132 is formed in the opening 162 for electrically connecting the metal plug 132 with the transition metal oxide layer 110 after the barrier layer 134 is formed.

In FIG. 4C and FIG. 4D, the process step of forming the barrier layer 134 on the dielectric layer 150 is performed to form the transition metal oxide layer 110 on the remaining portion of the dielectric layer 150. In an alternative embodiment, the process step of forming the barrier layer 134 on the dielectric layer 150 is performed to form the transition metal oxide layer on the first source/drain 314 as shown in FIG. 2B, and thereby the remaining portion of the dielectric layer 150 surrounds the transition metal oxide layer 110.

For an integrated information, the multi-layers (132/110/150/314) in FIG. 4 may be the stacked structure, e.g., W-plug/TiN/TiON/SiO2/Si from top to bottom. the multi-layers (132/

110/314) in FIG. 2B may be the stacked structure, e.g., W-plug/TiN/TiON/Si from top to bottom. In alternative embodiment, the multi-layers (132/110/150/314) in FIG. 4 may be the stacked structure, e.g., W-plug/TiN/TiOx/SiO2/Si from top to bottom. the multi-layers (132/110/314) in FIG. 2B may be the stacked structure, e.g., W-plug/TiN/TiOx/Si from top to bottom.

The foregoing outlines features of several embodiments so that those skilled in the art may better understand the aspects of the present invention. Those skilled in the art should appreciate that they may readily use the present invention as a basis for designing or modifying other processes and structures for carrying out the same purposes and/or achieving the same advantages of the embodiments introduced herein. Those skilled in the art should also realize that such equivalent constructions do not depart from the spirit and scope of the present invention, and that they may make various changes, substitutions and alterations herein without departing from the spirit and scope of the present invention.

What is claimed is:

1. A non-volatile memory device, comprising:
   a transistor, comprising:
      a gate dielectric layer disposed on a well;
      a gate electrode disposed on the gate dielectric layer; and
      a first source/drain and a second source/drain formed in the well and disposed at opposing sides of the gate electrode; and
   a variable and reversible resistive element, comprising:
      to a transition metal oxide layer for resistance change;
      a dielectric layer formed on the first source/drain; and
      at least one conductive plug module disposed on the transition metal oxide layer, comprising:
         a metal plug vertically disposed over the first source/drain; and
         a barrier layer surrounding the metal plug and electrically connected with the transition metal oxide layer, wherein the transition metal oxide layer is made by reacting a portion of the dielectric layer being directly below the metal plug with a portion of the barrier layer touching the portion of the dielectric layer, and thereby a remaining portion of the dielectric layer remains on the first source/drain after the transition metal oxide layer is formed.

2. The non-volatile memory device of claim 1, wherein the transition metal oxide layer is formed on the remaining portion of the dielectric layer, and the transition metal oxide layer is electrically coupled with the first source/drain via the remaining portion of the dielectric layer.

3. The non-volatile memory device of claim 1, wherein the transition metal oxide layer is formed on the first source/drain, and thereby the remaining portion of the dielectric layer surrounds transition metal oxide layer.

4. The non-volatile memory device of claim 1, wherein the dielectric layer consists essentially of oxide material.

5. The non-volatile memory device of claim 4, wherein the oxide material is selected from the group consisting of SiOx, SixNy, SiOxNy and combinations thereof.

6. The non-volatile memory device of claim 1, wherein the barrier layer comprises barrier material, wherein the barrier material is selected from the group consisting of titanium nitride, tantalum nitride and combinations thereof.

7. The non-volatile memory device of claim 1, wherein the metal plug comprises metal, wherein the metal is selected from the group consisting of tungsten, nickel, copper, aluminum and combinations thereof.

* * * * *